United States Patent
Alexander

(10) Patent No.: US 7,155,372 B2
(45) Date of Patent: Dec. 26, 2006

(54) METHODS AND APPARATUSES FOR FILTERING PULSES

(75) Inventor: William C. Alexander, Spicewood, TX (US)

(73) Assignee: BAE Systems Information and Electronic Systems, Nashua, NH (US)

( * ) Notice: Subject to any disclaimer, the term of this patent is extended or adjusted under 35 U.S.C. 154(b) by 445 days.

(21) Appl. No.: 10/627,186

(22) Filed: Jul. 25, 2003

(65) Prior Publication Data

US 2004/0125119 A1 Jul. 1, 2004

Related U.S. Application Data

(60) Provisional application No. 60/437,170, filed on Dec. 30, 2002.

(51) Int. Cl.
*H04B 15/00* (2006.01)
(52) U.S. Cl. ............... 702/190; 702/189; 702/193; 324/76.28
(58) Field of Classification Search ........ 702/190, 702/79, 57, 69, 66, 80, 124–126, 178, 189, 702/191, 193, 197; 324/76.71, 76.44, 76.28
See application file for complete search history.

(56) References Cited

U.S. PATENT DOCUMENTS

| | | | | |
|---|---|---|---|---|
| 5,142,170 A | * | 8/1992 | Tkacik | 327/39 |
| 5,194,768 A | * | 3/1993 | Lozano | 327/552 |
| 5,712,807 A | * | 1/1998 | Bangham | 708/300 |
| 6,598,007 B1 | * | 7/2003 | Moizio et al. | 702/145 |

* cited by examiner

*Primary Examiner*—Hal D. Wachsman
(74) *Attorney, Agent, or Firm*—Fulbright & Jaworski L.L.P.

(57) ABSTRACT

In one embodiment, a method that includes creating a filter structure using a parameter of a periodic pulse train, the filter structure having a plurality of time slots, each time slot being associated with a memory value; receiving a pulse at a time; incrementing the memory value associated with the time slot corresponding to the time the pulse was received; filtering the pulse if the memory value exceeds a threshold; and transmitting the pulse to a processor if the memory value does not exceed the threshold. In another embodiment, an apparatus that includes an input filter; a pulse detection circuit coupled to the input filter; a periodic pulse filter coupled to the pulse detection circuit; and a pulse queuing and transmission circuit coupled to the periodic pulse filter.

19 Claims, 4 Drawing Sheets

200

METHODS AND APPARATUSES FOR FILTERING PULSES

CROSS-REFERENCE(S) TO RELATED APPLICATION(S)

This application claims priority to U.S. Provisional Patent Application Ser. No. 60/437,170, filed Dec. 30, 2002, the entire contents of which are expressly incorporated by reference.

REFERENCE TO APPENDIX

This application includes a computer program listing appendix, submitted on compact disc (CD). The content of the CD is incorporated by reference in its entirety and accordingly forms a part of this specification. The CD contains the following files:
File name: mainforperiodicpulsefilter.txt File Size: 35.1 kb
File name: cyclicfilterlarge.txt File Size: 6.8 kb
Creation date for CD: Jun. 25, 2003

The portion of this disclosure contained on CD of this patent document contains material that is subject to copyright protection. The copyright owner has no objection to the facsimile reproduction by anyone of the patent document or the patent disclosure on the CD, as it appears in the Patent and Trademark Office patent files or records, but otherwise reserves all copyright rights whatsoever.

BACKGROUND OF THE INVENTION

1. Field of the Invention

The invention relates generally to the field of signal processing. More particularly, the invention relates to a method and apparatus for filtering pulses.

2. Discussion of the Related Art

Typical data acquisition systems may include sensors (or transducers) and signal conditioning elements used to transform analog signals into digital data for further processing by a computer, processor, or the like. Such systems may be useful in a variety of applications including, for example, digital communications and pulse detection.

Unfortunately, data acquisitions systems are often subject to electrical noise or interference, causing the resulting digital data stream to include unwanted information. For example, periodic pulse interference is a common problem in pulse detection applications. One solution to this problem involves detecting the undesired periodic pulses and filtering them out of the data stream.

Prior art techniques require all of the data stream—that is, desired and undesired pulses—to be passed on to the processor. The processor then filters out the undesired pulses in software. A problem with this technology is that it requires a high performance processor to keep up with the data streams. Another problem with this technology is that it requires a high bandwidth communications link between the digital front-end and the processor.

SUMMARY OF THE INVENTION

In one embodiment, the invention is a method that includes creating a filter structure using a parameter of a periodic pulse train, the filter structure having a plurality of time slots, each time slot being associated with a memory value; receiving a pulse at a time; incrementing the memory value associated with the time slot corresponding to the time the pulse was received; filtering the pulse if the memory value exceeds a threshold; and transmitting the pulse to a processor if the memory value does not exceed the threshold. Other embodiments of the present methods are described below.

In another embodiment, the invention is an apparatus that includes an input filter; a pulse detection circuit coupled to the input filter; a periodic pulse filter coupled to the pulse detection circuit, the periodic pulse filtering circuit operable to use a parameter to create a filter structure, the filter structure having a plurality of time slots, each time slot being associated with a memory value, receive a pulse, increment the memory value associated with the time slot corresponding to the time the received pulse arrived, and filter the pulse if the memory value exceeds a threshold; and a pulse queuing and transmission circuit coupled to the periodic pulse filter. Other embodiments of the present apparatuses are described below.

BRIEF DESCRIPTION OF THE DRAWINGS

The following drawings demonstrate aspects of the present methods and apparatuses. They illustrate by way of example and not limitation. Like reference numbers refer to similar elements.

DETAILED DESCRIPTION

In this document (including the claims), the terms "comprise" (and any form of comprise, such as "comprises" and "comprising"), "have" (and any form of have, such as "has" and "having"), and "include" (and any form of include, such as "includes" and "including") are open-ended linking verbs. For example, a method "comprising" creating a filter structure using a parameter of a periodic pulse train; receiving a pulse at a time; incrementing the memory value associated with the time slot corresponding to the time the pulse was received; filtering the pulse if the memory value exceeds a threshold; and transmitting the pulse to a processor if the memory value does not exceed the threshold is a method that possesses at least these steps, but is not limited to possessing only these steps.

Similarly, an apparatus "comprising" an input filter; a pulse detection circuit coupled to the input filter; a periodic pulse filter coupled to the pulse detection circuit; and a pulse queuing and transmission circuit coupled to the periodic pulse filter is an apparatus that possesses at least these structures, but is not limited to possessing only these structures. For example, this apparatus also covers an apparatus that possesses an analog-to-digital converter coupled to the input filter.

The terms "a" and "an" are defined as one or more than one. The term "another" is defined as at least a second or more. The term "coupled" is defined as connected, although not necessarily directly, and not necessarily mechanically. The term "approximately" is defined as at least close to a given value (e.g., preferably within 10% of, more preferably within 1% of, and most preferably within 0.1% of). The term "program" and "computer program" are defined as a sequence of instructions designed for execution on a computer system.

Those of ordinary skill in the art will appreciate that in the detailed description below, certain well known components and assembly techniques have been omitted so that the invention is not obscured in unnecessary detail.

The invention may include a method and apparatus for filtering out a periodic pulse embedded in a data stream. A "periodic pulse" is defined as a pulse in a periodic pulse train. In one exemplary embodiment, the invention may include a digital front-end that removes the periodic pulse before the data stream is sent to a pulse processor, thus decreasing the processor load and reducing the communications bandwidth requirement between the digital front-end and the processor.

Figure 1:
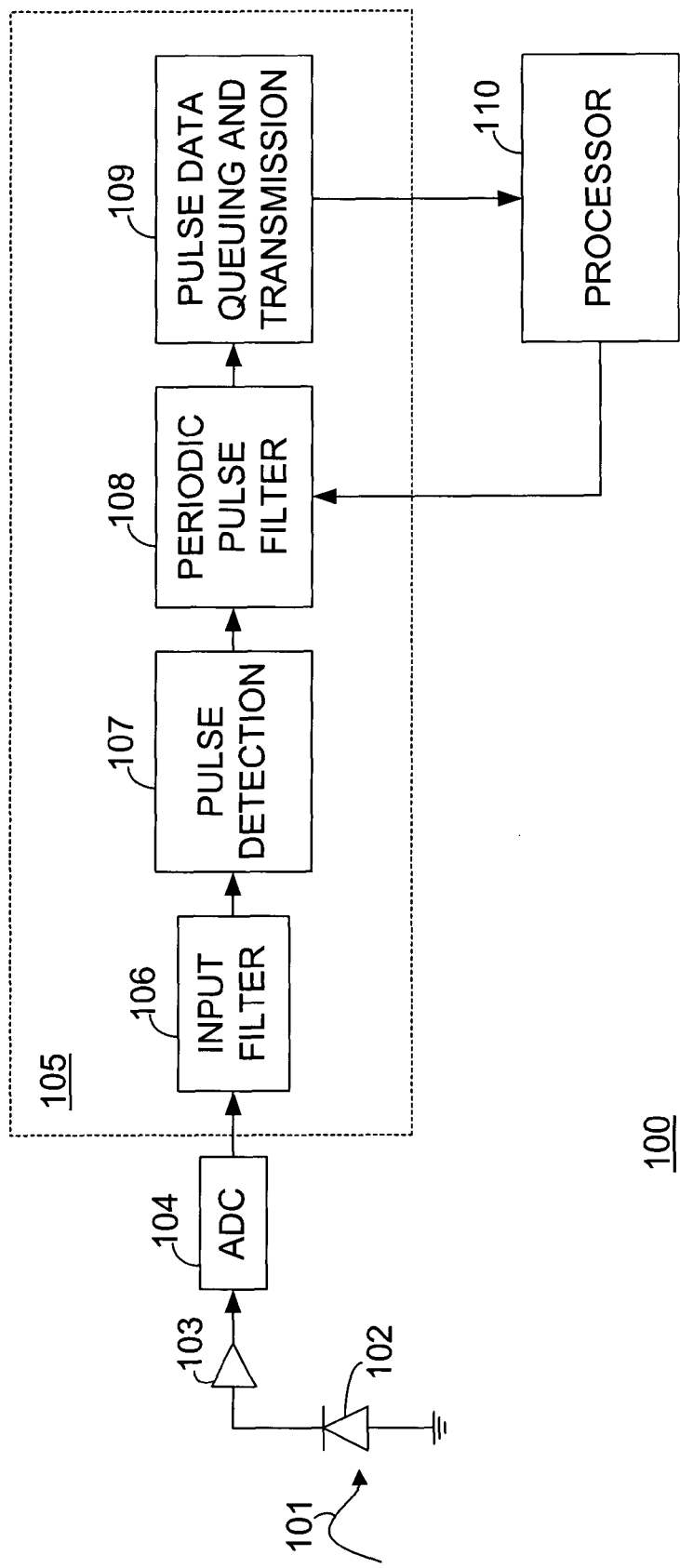
FIG. 1 is a block diagram of one embodiment of a pulse processing system suitable for use with the present methods and apparatuses.

Referring to FIG. 1, a block diagram of one embodiment of a pulse processing system 100 is depicted. Analog signal 101 is detectable by sensor 102. Sensor 102 is coupled to amplifier 103. Amplifier 103 is coupled to analog-to-digital converter 104. Analog-to-digital converter 104 is coupled to input filter 106 of digital front-end circuit 105. Input filter 106 is coupled to pulse detector circuit 107, and pulse detector circuit 107 is coupled to periodic pulse filter 108. Periodic pulse filter 108 is coupled to pulse data queuing and transmission circuit 109, and pulse data queuing and transmission circuit 109 is coupled to processor 110. Processor 110 is also coupled to periodic pulse filter 108.

In one exemplary embodiment, analog signal 101 may be an electromagnetic signal such as light or a laser, and sensor 102 may be a photodiode. Processor 110 may be a pulse processor, a digital signal processor (DSP), a computer, or the like.

In practice, digital front-end circuit 105 may be an integrated circuit or a programmable circuit, such as, for example, a programmable logic device (PLD), a field-programmable gate array (FPGA). When digital front-end circuit 105 is a programmable circuit, a program, such as that presented below and discussed in detail with reference to FIG. 3, creates an apparatus in accordance with the present invention that operates in accordance with methods of the present invention. In the alternative, digital front-end circuit 105 may be hard-wired or may use predetermined data tables, or may be a combination of hard-wired and programmable circuitry.

When in operation, sensor 102 transforms analog signal 101 into an electrical signal to be amplified by amplifier 103. The amplified signal is converted into a digital signal by analog-to-digital converter 104, and enters digital front-end 105 via input filter 106. Input filter 106 may be, for example, a high-pass filter to correct for an undesirable effect resulting from an analog-to-digital conversion. Next, the signal is fed into pulse detection circuit 107, which identifies pulses and delivers an unfiltered data stream to periodic pulse filter 108. At periodic pulse filter 108, a periodic pulse is filtered out of the data stream and the resulting filtered data stream is transmitted to processor 110 via pulse data queuing and transmission circuit 109.

In one embodiment, processor 110 may identify a periodic pulse train in the data stream, extract parameters from the periodic pulse train, and feed the extracted parameters to digital front-end 105. Specifically, processor 110 may identify periodic pulses by the pulse repetition frequency (PRF) of the periodic pulse train and send one or more parameters to periodic pulse filter 108, where the parameters sent may include: a time slot width, a number of time slots, a modification parameter, and a filter threshold. Periodic pulse filter 108 may then implement a periodic filter structure that divides time into slots as detailed in FIG. 2.

Figure 2:
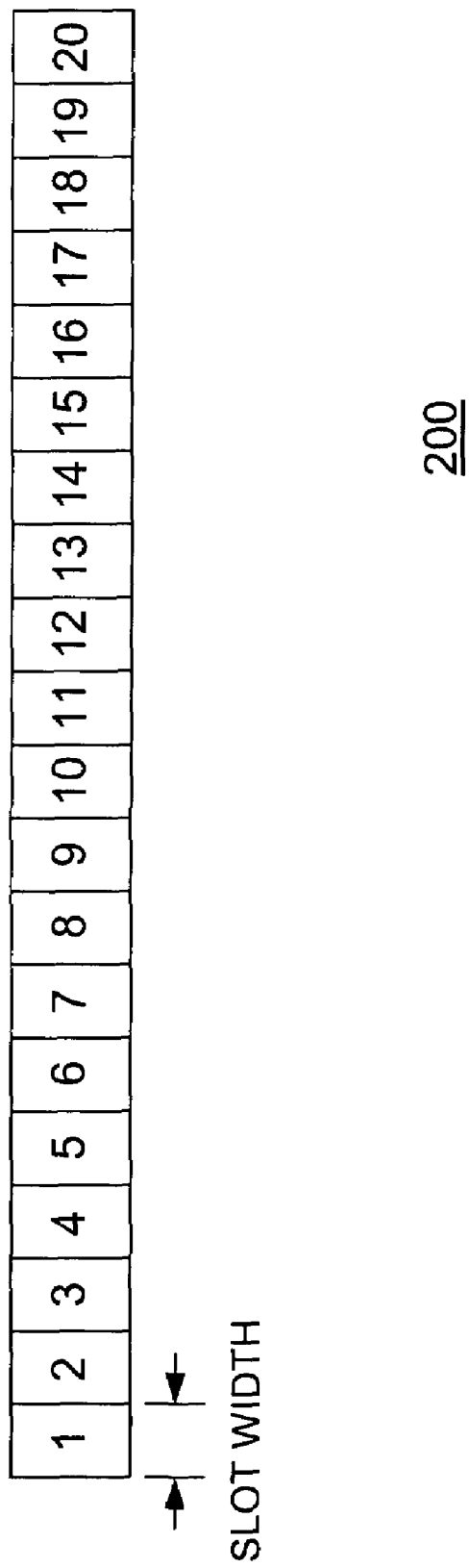
FIG. 2 is a diagram of one embodiment of a periodic pulse filter structure suitable for use with the present methods and apparatuses.

Referring to FIG. 2, a diagram of one embodiment of a periodic pulse filter structure 200 is depicted. Periodic filter structure 200 may divide time into, for example, 20 time slots of substantially equal width. In other embodiments, structure 200 may include hundreds or thousands of time slots.

Referring to FIGS. 1 and 2, the number of slots and the slot width of filter structure 200 may be included in parameters provided to periodic pulse filter 108 by processor 110. In one embodiment, the width of each slot is determined by the maximum jitter in the periodic pulse train. In another embodiment, the total length (in time) of structure 200 is approximately equal to the inverse of the pulse repetition frequency (or pulse repetition interval (PRI)) of the periodic pulse train. A modification parameter, also provided to periodic pulse filter 108 by processor 110, may modify the width of the last time slot in structure 200 (slot number 20) in order to approximately match the structure length with the pulse repetition interval of the periodic pulse train, causing its periodic pulses to always fall into the same time slot.

Figure 3:
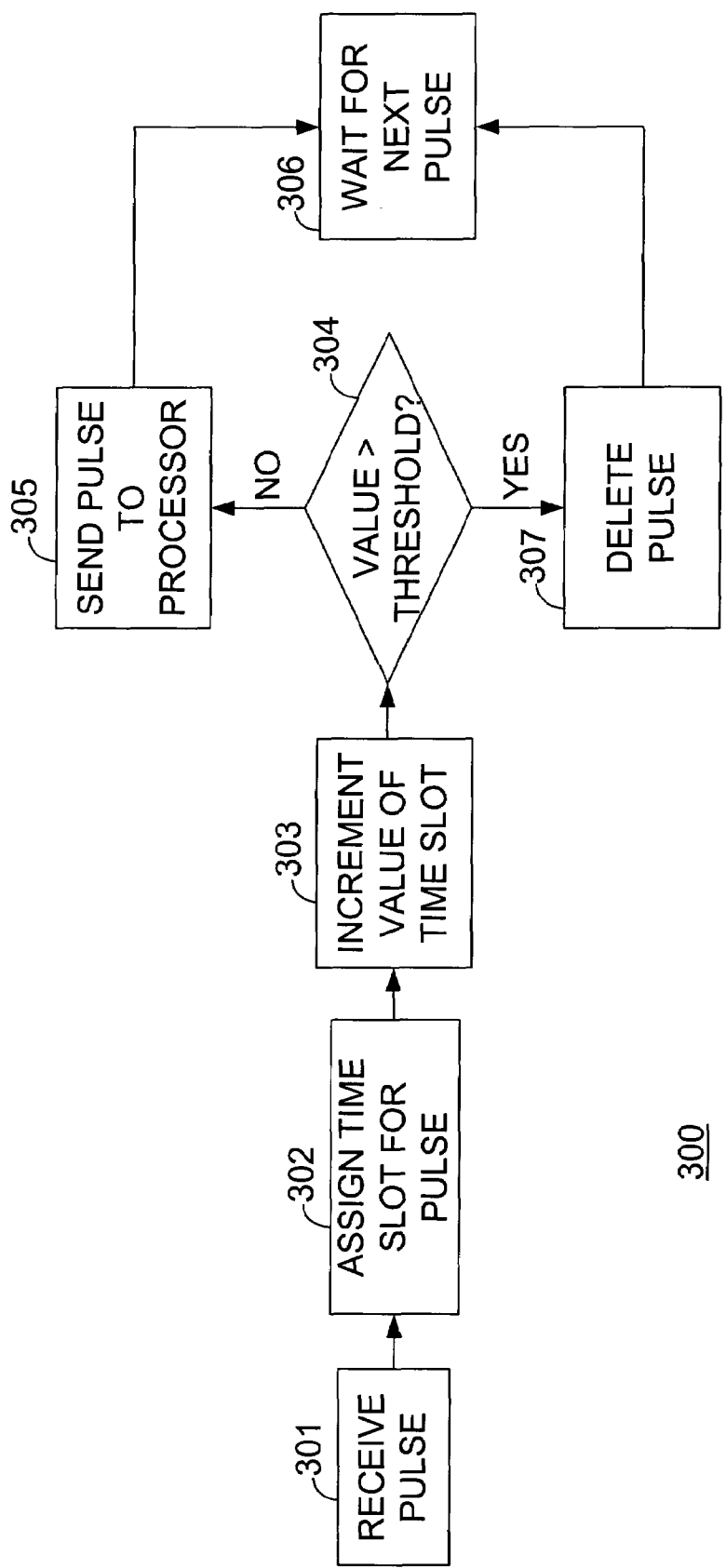
FIG. 3 is a flowchart of one embodiment of a periodic pulse filtering method suitable for use with the present methods and apparatuses.

Referring to FIG. 3, a flowchart of one embodiment of a periodic pulse filtering method 300 is depicted. Method 300 may be performed by periodic pulse filter 108 of digital front-end 105 as detailed in FIG. 1.

In step 301, a pulse is received. Next, a time slot, such as the one depicted as part of filter structure 200 of FIG. 2, is assigned to the pulse in step 302. Then, a value in memory corresponding to the slot is incremented by step 303, and control passes to step 304. If a memory value corresponding to the slot exceeds a filter threshold, the pulse is deleted by step 307. Otherwise the pulse is transmitted to a processor by step 305. The algorithm waits for the next pulse to arrive in step 306.

In one embodiment, method 300 is repeated several times. Each time a pulse falls into a time slot, its value in memory may be incremented. Because the periodic pulse train delivers its pulses always on the same time slot, after a few iterations the memory value corresponding to the slot may exceed the filter threshold and the corresponding periodic pulse may be filtered out of the data stream. In one embodiment, the filter threshold value is provided to periodic pulse filter 108 of FIG. 1 by processor 110. A non-periodic pulse train, or a periodic pulse train that has a PRI value different from the filter structure 200 length (detailed in FIG. 2), is not filtered out because the time distribution of its pulses is approximately uniform among all slots.

In another embodiment, a background process may run continuously and attenuate all memory values associated with each time slot, such that if the periodic pulse train stops, the filter no longs blocks any pulses. The background attenuation process combined with the spreading of non-periodic pulses may prevent slot values from exceeding the filter threshold, thus allowing non-periodic pulses to be transmitted to the processor. In yet another embodiment, another periodic pulse filter similar to the one detailed above may be used simultaneously so that multiple periodic pulse trains may be filtered. Moreover, three or more periodic pulse filters may be used consistent with the present methods and apparatuses to filter multiple periodic pulse trains.

Software or computer instructions configured to carry out one or more steps of method 300 may be loaded onto a computer readable medium. One of ordinary skill in the art will understand that computer readable medium may take many forms, including any data storage device that can store data that can thereafter be read by a processor, a computer or a computer system, including, for example, a disk, such as a floppy disk, a zip disk, or the like; read-only memory; random access memory; CD-ROMs; magnetic tape; optical data storage devices, SMARTMEDIA® cards; flash memory; compact flash memory; and the like. The computer readable medium can also be distributed over network-coupled computer systems so that the computer readable instructions are stored and executed in a distributed fashion. For example, the computer readable medium may also take the form of a carrier wave such as, for example, signals on a wire (e.g., signals downloaded from the Internet) or those that are transmitted electromagnetically or through infra red means.

Shown in the computer program listing appendix (see CD) is an exemplary source code written in Altera Hardware Description Language that is suitable for carrying out steps described above, and which may be used in conjunction with a field programmable gate array (FPGA) such as, for example, the APEX 20KE FPGA (EP20K200E) from Altera Corporation. The code is an example of how to filter a digital pulse according to the methods detailed in FIG. 3 and described above. This code is exemplary and does not limit the scope of the claims. It simply represents one specific embodiment for carrying out steps associated with the present methods and is included for the convenience of the reader in this regard. Those of ordinary skill in the art having the benefit of this disclosure will recognize that a wide variety of computational techniques and/or different types of corresponding source code may be used in implementing the present methods.

Table I illustrates an implementation of a 20-slot pulse filter over ten cycles. In this example, the filter structure is tuned to a periodic signal that falls into the seventh slot. The total length of the structure is approximately equal to the PRI of the periodic pulse train to be filtered.

TABLE I

Pulse Filter Implementation

| Slot Number | Filter Cycles | | | | | | | | | |
|---|---|---|---|---|---|---|---|---|---|---|
| | 1 | 2 | 3 | 4 | 5 | 6 | 7 | 8 | 9 | 10 |
| 1 | 0 | 0 | 10 | 8 | 6.4 | 5.12 | 4.96 | 3.28 | 2.62 | 12.1 |
| 2 | 0 | 0 | 0 | 0 | 0 | 0 | 0 | 0 | 0 | 0 |
| 3 | 10 | 8 | 6.4 | 5.12 | 14.1 | 11.3 | 9.02 | 7.22 | 5.77 | 4.62 |
| 4 | 0 | 0 | 0 | 0 | 0 | 0 | 0 | 0 | 0 | 0 |
| 5 | 0 | 0 | 0 | 0 | 0 | 0 | 0 | 10 | 8 | 6.4 |
| 6 | 0 | 0 | 0 | 0 | 0 | 0 | 0 | 0 | 0 | 0 |
| 7 | 10 | 18 | 24.4 | 29.5 | 33.6 | 36.9 | 39.5 | 0 | 0 | 0 |
| 8 | 0 | 0 | 0 | 0 | 0 | 0 | 0 | 0 | 0 | 0 |
| 9 | 0 | 0 | 0 | 0 | 0 | 0 | 0 | 0 | 0 | 0 |
| 10 | 0 | 0 | 0 | 0 | 0 | 0 | 0 | 0 | 0 | 0 |
| 11 | 0 | 0 | 0 | 0 | 0 | 0 | 0 | 0 | 0 | 0 |
| 12 | 0 | 10 | 8 | 6.4 | 5.12 | 14.1 | 11.3 | 9.02 | 7.22 | 5.77 |
| 13 | 0 | 0 | 0 | 0 | 0 | 0 | 0 | 0 | 10 | 8 |
| 14 | 0 | 0 | 0 | 0 | 0 | 0 | 0 | 0 | 0 | 0 |
| 15 | 0 | 0 | 0 | 10 | 8 | 6.4 | 5.12 | 4.1 | 3.28 | 2.62 |
| 16 | 0 | 0 | 0 | 0 | 0 | 0 | 0 | 0 | 0 | 0 |
| 17 | 0 | 0 | 0 | 0 | 0 | 0 | 0 | 0 | 0 | 0 |
| 18 | 0 | 0 | 0 | 0 | 0 | 0 | 0 | 0 | 0 | 0 |
| 19 | 0 | 0 | 0 | 0 | 0 | 0 | 0 | 0 | 0 | 0 |
| 20 | 0 | 0 | 0 | 0 | 0 | 0 | 10 | 8 | 6.4 | 5.12 |

Still referring to Table I, in this particular example, the filter threshold is set to 40. Thus when the value in memory associated with the seventh slot exceeds 40 (during the eighth cycle), the pulse is deleted. All other pulses falling in slots 1–6 and 8–20 are non-periodic or have a period different than the length of the filter, and are spread among these slots. Due to the attenuation factor from the background process, the memory values associated with slots 1–6 and 8–20 do not reach the threshold.

Figure 4:
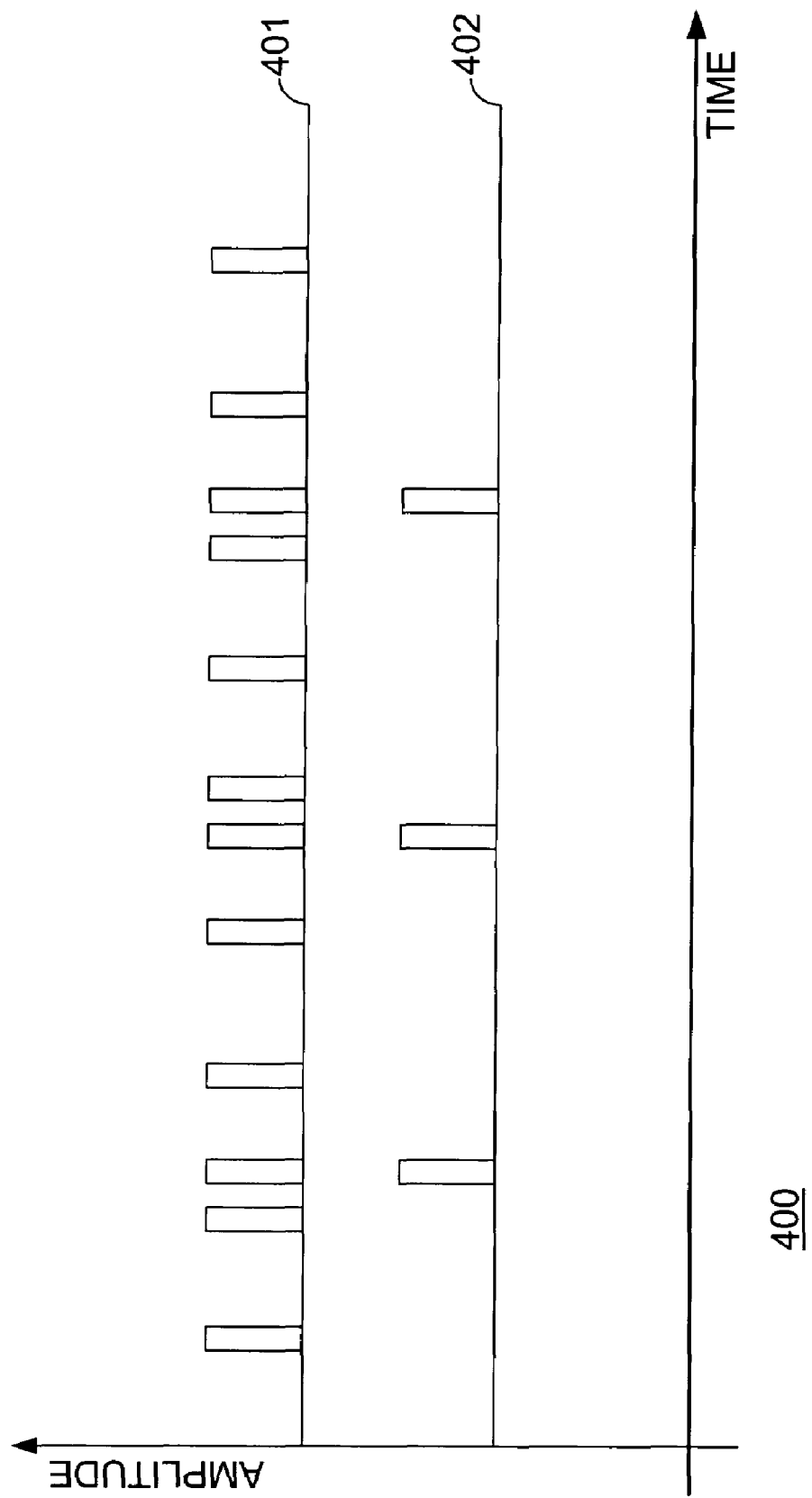
FIG. 4 is a graph of filtered and unfiltered simulated data streams, illustrating an aspect of the invention.

Referring to FIG. 4, a graph of filtered and unfiltered simulated data streams 400 is depicted illustrating an aspect of the invention. The horizontal axis is time, and the vertical axis is the amplitude. An unfiltered data stream 401 containing two pulse streams at different frequencies is processed by a filter operating with a structure tuned to one of the frequencies (undesired) as described above. The resulting filtered data stream 402 contains only the desired frequency.

The individual components described above need not be made in the exact disclosed forms, or combined in the exact disclosed configurations, but could be provided in any suitable form, and/or combined in any suitable configuration. It will also be clear to those of ordinary skill in the art that substitutions, modifications, additions and/or rearrangements of the features of the inventive methods and devices may be made without deviating from their scope, which is defined by the claims and their equivalents. The appended claims are not to be interpreted as including means-plus-function limitations, unless such a limitation is explicitly recited in a given claim using the phrase(s) "means for" and/or "step for," respectively.

I claim:

1. A method comprising:
   creating a filter structure using a parameter of a periodic pulse train, the filter structure having a plurality of time slots, each time slot being associated with a memory value;
   receiving a pulse at a time;
   incrementing the memory value associated with the time slot corresponding to the time the pulse was received;
   filtering the pulse if the memory value exceeds a threshold; and
   transmitting the pulse to a processor if the memory value does not exceed the threshold.

2. The method of claim 1, where the parameter is a time slot width.

3. The method of claim 1, where the parameter is a number of time slots.

4. The method of claim 1, where the filter structure includes a length, and the creating includes using (a) a time slot width and (b) a number of time slots to match the length of the filter structure with a pulse repetition interval of the periodic pulse train.

5. The method of claim 1, where the parameter is a modification parameter.

6. The method of claim 5, where the modification parameter is the width of a last time slot of the filter structure.

7. The method of claim 1, where the parameter is the threshold.

8. The method of claim 1, where the filtering includes deleting the pulse.

9. A data storage device comprising machine readable instructions for:
   creating a filter structure using a parameter of a periodic pulse train, the filter structure having a plurality of time slots, each time slot being associated with a memory value;
   receiving a pulse at a time;
   incrementing the memory value associated with the time slot corresponding to the time the pulse was received;
   filtering the pulse if the memory value exceeds a threshold; and
   transmitting the pulse to a processor if the memory value does not exceed the threshold.

10. The data storage device of claim 9, where the parameter is a time slot width.

11. The data storage device of claim 9, where the parameter is a number of time slots.

12. The data storage device of claim 9, where the filter structure includes a length, and the creating includes using (a) a time slot width and (b) a number of time slots to match the length of the filter structure with a pulse repetition interval of the periodic pulse train.

13. The data storage device of claim 9, where the parameter is a modification parameter.

14. The data storage device of claim 13, where the modification parameter is the width of a last time slot of the filter structure.

15. The data storage device of claim 9, where the parameter is the threshold.

16. The data storage device of claim 9, where the filtering includes deleting the pulse.

17. An apparatus comprising:
   an input filter;
   a pulse detection circuit coupled to the input filter;
   a periodic pulse filter coupled to the pulse detection circuit, the periodic pulse filter operable to:
      use a parameter to create a filter structure, the filter structure having a plurality of time slots, each time slot being associated with a memory value;
      receive a pulse at a time;
      increment the memory value associated with the time slot corresponding to the time the received pulse arrived, and
      filter the pulse if the memory value exceeds a threshold; and
   a pulse queuing and transmission circuit coupled to the periodic pulse filter.

18. The apparatus of claim 17, farther comprising an analog-to-digital converter coupled to the input filter.

19. The apparatus of claim 17, farther comprising a processor coupled to the pulse queuing and transmission circuit.

* * * * *

UNITED STATES PATENT AND TRADEMARK OFFICE
CERTIFICATE OF CORRECTION

PATENT NO.         : 7,155,372 B2                                             Page 1 of 1
APPLICATION NO. : 10/627186
DATED               : December 26, 2006
INVENTOR(S)        : William C. Alexander It is certified that error appears in the above-identified patent and that said Letters Patent is hereby corrected as shown below:

In claim 18, column 8, line 24, replace "farther" with --further--.

In claim 19, column 8, line 26, replace "farther" with --further--.

Signed and Sealed this

Nineteenth Day of June, 2007

JON W. DUDAS
*Director of the United States Patent and Trademark Office*